(12) United States Patent
Van Empel (10) Patent No.: US 8,451,429 B2
(45) Date of Patent: May 28, 2013

(54) DICHROIC MIRROR, METHOD FOR MANUFACTURING A DICHROIC MIRROR, LITHOGRAPHIC APPARATUS, SEMICONDUCTOR DEVICE AND METHOD OF MANUFACTURING THEREFOR

(75) Inventor: Tjarko Adriaan Rudolf Van Empel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 886 days.

(21) Appl. No.: 12/434,426

(22) Filed: May 1, 2009

(65) Prior Publication Data

US 2009/0284728 A1 Nov. 19, 2009

Related U.S. Application Data

(60) Provisional application No. 61/071,518, filed on May 2, 2008.

(51) Int. Cl.
 *G03B 27/72* (2006.01)
 *G03B 27/54* (2006.01)
 *G02B 5/20* (2006.01)
 *G03F 7/20* (2006.01)
 *G02B 27/14* (2006.01)

(52) U.S. Cl.
 CPC ............ *G03F 7/7015* (2013.01); *G02B 27/141* (2013.01); *G03F 7/70575* (2013.01)
 USPC ................ 355/71; 355/69; 359/359; 359/634

(58) Field of Classification Search
 CPC .. G02B 5/0891; G02B 27/141; G03F 7/70575; G03F 7/7015; G03F 7/702
 USPC ........... 355/67, 71; 359/566, 569, 572, 359/591, 580, 584, 586, 589, 618, 627, 634, 359/839, 884; 378/34
 See application file for complete search history.

(56) References Cited

U.S. PATENT DOCUMENTS 4,277,138 A * 7/1981 Dammann .................... 359/569
4,888,260 A * 12/1989 Cowan .............................. 430/1

(Continued)

FOREIGN PATENT DOCUMENTS

WO 98/40791 A1 9/1998

OTHER PUBLICATIONS

W. Partlo, I. Fomenkov, R. Oliver, D. Birx, "Development of an EUV (13.5 nm) Light Source Employing a Dense Plasma Focus in Lithium Vapor", Proc. SPIE 3997, pp. 136-156 (2000).

(Continued)

*Primary Examiner* — Steven H Whitesell Gordon
(74) *Attorney, Agent, or Firm* — Pillsbury Winthrop Shaw Pittman LLP (57) ABSTRACT

A dichroic mirror configured to separate a first type of radiation in a first wavelength range having an upper boundary from a second type of radiation in a second wavelength range having a lower boundary greater than the upper boundary of the first wavelength. The mirror includes a substrate, and a stack having a reflective surface facing away from the substrate and a width that increases stepwise in a direction towards the substrate. The stack is formed by alternating layers of first and second materials on the substrate. The reflective surface has steps with a width greater than the upper boundary of the first wavelength and less than the lower boundary of the second wavelength.

15 Claims, 5 Drawing Sheets

U.S. PATENT DOCUMENTS

| | | | | |
|---|---|---|---|---|
| 5,471,321 A | * | 11/1995 | Setani | 358/474 |
| 5,742,373 A | * | 4/1998 | Alvelda | 349/201 |
| 5,969,441 A | | 10/1999 | Loopstra et al. | |
| 6,046,792 A | | 4/2000 | Van Der Werf et al. | |
| 6,469,827 B1 | * | 10/2002 | Sweatt et al. | 359/351 |
| 7,221,512 B2 | * | 5/2007 | Steenblik et al. | 359/569 |
| 7,248,667 B2 | * | 7/2007 | Weiss et al. | 378/34 |
| 2003/0058986 A1 | * | 3/2003 | Oshino et al. | 378/34 |
| 2003/0081722 A1 | * | 5/2003 | Kandaka et al. | 378/70 |
| 2005/0024614 A1 | * | 2/2005 | Bakker | 355/67 |
| 2005/0112510 A1 | * | 5/2005 | Bakker | 430/396 |
| 2005/0122589 A1 | * | 6/2005 | Bakker | 359/591 |
| 2008/0309996 A1 | * | 12/2008 | Cowan | 359/3 |

OTHER PUBLICATIONS

M.W. McGeoch, "Power Scaling of a Z-pinch Extreme Ultraviolet Source", Proc. SPIE 3997, pp. 861-866 (2000).

W.T. Silfvast, M. Klosner, G. Shimkaveg, H. Bender, G. Kubiak, N. Fornaciari, "High-Power Plasma Discharge Source at 13.5 and 11.4 nm for EUV lithography", Proc. SPIE 3676, pp. 272-275 (1999).

K. Bergmann et al., "Highly Repetitive, Extreme Ultraviolet Radiation Source Based on a Gas-Discharge Plasma", Applied Optics, vol. 38, pp. 5413-5417 (1999).

* cited by examiner

DICHROIC MIRROR, METHOD FOR MANUFACTURING A DICHROIC MIRROR, LITHOGRAPHIC APPARATUS, SEMICONDUCTOR DEVICE AND METHOD OF MANUFACTURING THEREFOR

CROSS-REFERENCE TO RELATED APPLICATIONS

This application claims the benefit of U.S. Provisional Application No. 61/071,518, which was filed on May 2, 2008, and which is incorporated herein in its entirety by reference.

FIELD

The invention relates to a dichroic mirror, a lithographic apparatus including a dichroic mirror, a method of manufacturing a dichroic mirror, a method of manufacturing a semiconductor device, and a semiconductor device.

BACKGROUND

Lithography is a process used to create features on the surface of substrates. Such substrates can include those used in the manufacture of flat panel displays, circuit boards, various integrated circuits (ICs), and the like. A frequently used substrate for such applications is a semiconductor wafer. One skilled in the relevant art will recognize that the description herein also applies to other types of substrates. In such a case, a patterning structure may generate a circuit pattern corresponding to an individual layer of the IC, and this pattern can be imaged onto a target portion (e.g. comprising one or more dies) on a substrate (e.g., a silicon wafer) that has been coated with a layer of radiation-sensitive material (e.g., a resist). In general, a single substrate will contain a whole network of adjacent target portions that are successively irradiated via the projection system, one at a time. In current apparatus, employing patterning by a patterning structure on a support (e.g., a mask table), a distinction can be made between two different types of machines. In one type of lithographic projection apparatus, each target portion is irradiated by exposing the entire pattern of the patterning structure onto the target portion at once; such an apparatus is commonly referred to as a wafer stepper. In another type of apparatus, commonly referred to as a step-and-scan apparatus, each target portion is irradiated by progressively scanning the pattern of the patterning structure under the projection beam in a given reference direction (the "scanning" direction) while synchronously scanning the substrate support parallel or anti-parallel to this direction. Since, in general, the projection system will have a magnification factor M (with M<1) the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (e.g., a resist). Prior to this imaging step, the substrate may undergo various procedures, such as priming, resist coating, and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are desired, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". The position of a second element traversed by the projection beam relative to a first element traversed by the projection beam will for simplicity hereinafter be referred to as "downstream" of or "upstream" of said first element. In this context, the expression "downstream" indicates that a displacement from the first element to the second element is a displacement along the direction of propagation of the projection beam; similarly, "upstream" indicates that a displacement from the first element to the second element is a displacement opposite to the direction of propagation of the projection beam. Further, the lithographic apparatus may be of a type having two or more substrate tables (and/or two or more mask tables). In such "multiple stage" devices, the additional tables may be used in parallel, or preparatory steps may be carried out on one or more tables while one or more other tables are being used for exposures. Dual stage lithographic apparatus are described, for example, in U.S. Pat. No. 5,969,441 and International patent application publication no. WO 98/40791, both of which are incorporated herein by reference.

There is a desire to integrate an ever-increasing number of electronic components in an IC. In a lithographic apparatus, the size of features that can be imagined onto the substrate may be limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation in the range 5 to 20 nm, especially around 13 nm. Such radiation is termed extreme ultraviolet (EUV) or soft x-ray and possible sources include, for instance, laser-produced plasma sources, discharge plasma sources, or synchrotron radiation from electron storage rings. Apparatus using discharge plasma sources are described in: W. Partlo, I. Fomenkov, R. Oliver, D. Birx, "Development of an EUV (13.5 nm) Light Source Employing a Dense Plasma Focus in Lithium Vapor", Proc. SPIE 3997, pp. 136-156 (2000); M. W. McGeoch, "Power Scaling of a Z-pinch Extreme Ultraviolet Source", Proc. SPIE 3997, pp. 861-866 (2000); W. T. Silfvast, M. Klosner, G. Shimkaveg, H. Bender, G. Kubiak, N. Formaciari, "High-Power Plasma Discharge Source at 13.5 and 11.4 nm for EUV lithography", Proc. SPIE 3676, pp. 272-275 (1999); and K. Bergmann et al., "Highly Repetitive, Extreme Ultraviolet Radiation Source Based on a Gas-Discharge Plasma", Applied Optics, Vol. 38, pp. 5413-5417 (1999).

EUV radiation sources may use a relatively high partial pressure of a gas or vapor to emit EUV radiation, such as discharge plasma radiation sources referred to above. In a discharge plasma source, for instance, a discharge is created in between electrodes, and a resulting partially ionized plasma may subsequently be caused to collapse to yield a very hot plasma that emits radiation in the EUV range. The very hot plasma is often created in Xe, since a Xe plasma radiates in the Extreme UV (EUV) range around 13.5 nm. For an efficient EUV production, a typical pressure of 0.1 mbar is desired near the electrodes to the radiation source. A drawback of having such a relatively high Xe pressure is that Xe gas absorbs EUV radiation. For example, 0.1 mbar Xe transmits over 1 m only 0.3% EUV radiation having a wavelength of 13.5 nm. It is therefore desirable to confine the rather high Xe pressure to a limited region around the source. To reach this, the source can be contained in its own vacuum chamber that is separated by a chamber wall from a subsequent vacuum chamber in which the collector mirror and illumination optics may be located.

Another source for EUV-radiation, known as a laser-produced plasma (LPP) source typically uses a $CO_2$ laser. In current lithographic systems, radiation from the laser, having a wavelength of 10.6 μm may be able to reach the wafer with significant power. Part of this power is absorbed by the wafer, which may cause unwanted heating of the wafer.

Thermal radiation emanating from, among others, the EUV source and a foil trap in a lithographic projection apparatus may result in heating of the objects on which it impinges. In a lithographic projection apparatus, these objects will generally be the optical components which make up the apparatus. An example of an optical component placed in the vicinity of the source, may be formed by a set of reflectors which function as a collector for light emanating from the source. Heating up of the collector due to this thermal radiation may lead to expansion of parts in the collector, which may cause geometrical aberrations of the collector and, ultimately, may lead to its destruction.

SUMMARY

It is an aspect of an embodiment of the invention to provide a dichroic mirror configured to remove the infrared radiation from the optical path towards the wafer.

It is an aspect of an embodiment of the invention to provide a lithographic apparatus that includes such a dichroic mirror.

It is an aspect of an embodiment of the invention to provide a method of manufacturing such a dichroic mirror.

It is an aspect of an embodiment of the invention to provide a method of manufacturing a semiconductor device.

It is an aspect of an embodiment of the invention to provide a semiconductor device.

According to an aspect of an embodiment of the invention, there is provided a dichroic mirror configured to separate a radiation in a first wavelength range having an upper boundary $\lambda 1$ from radiation in a second wavelength range having a lower boundary $\lambda 2$ greater than $\lambda 1$. The mirror includes a substrate, and at least one stack having a reflective surface facing away from the substrate. The stack includes alternating layers of first and second materials on the substrate. The first and second materials are configured to provide relative etch selectivity. A width of the stack increases stepwise in a direction towards the substrate. The reflective surface has steps with a width greater than $\lambda 1$ and less than $\lambda 2$. In this way a surface is formed that is stepwise inclined with respect to the substrate. The one or more stacks may for example stepwise incline at both sides of their top. The inclination may be the same for both sides, so that the resulting shape of the one or more stacks is asymmetric. In an embodiment, the one or more stacks may incline at only one side of their top and have a surface at the other side that is substantially transverse to the surface of the substrate.

In an embodiment, there is provided a dichroic mirror that is configured to separate a first type of radiation in a first wavelength range having an upper boundary from a second type of radiation in a second wavelength range having a lower boundary greater than the upper boundary of the first wavelength. The mirror includes a substrate, and a stack having a reflective surface facing away from the substrate and a width that increases stepwise in a direction towards the substrate. The stack is formed by alternating layers of first and second materials on the substrate. The reflective surface has steps with a width greater than the upper boundary of the first wavelength and less than the lower boundary of the second wavelength.

The dichroic mirror may comprise a plurality of stacks. The stacks may have a height and may be arranged at the substrate with a pitch. A ratio between the pitch and the height may be in a range of between about 5 and about 25.

The radiation in the first wavelength range has a wavelength that is smaller than the width of the steps. Accordingly the normal of the steps may determine the reflection direction of the EUV radiation. The wavelength of the radiation in the second wavelength range is larger than the size of the steps. Accordingly the surface of the mirror may appear to radiation in this wavelength range as a surface interpolated through the steps of the stacks that follows the global inclination. This surface has a surface normal that deviates from that of the individual steps. Accordingly the radiation in the first and the second wavelength ranges may be reflected in mutually different directions.

This principle is may be particularly suitable to separate the radiation in the infrared range, having a wavelength greater than $\lambda 2$ of about 1 μm from the desired radiation in the extreme UV range having a wavelength of less than $\lambda 1$ of about 100 nm.

The dichroic mirror according to an embodiment of the present invention is formed by alternating layers of first and second materials on the substrate. The first and second materials are configured to provide relative etch selectivity. In the embodiment wherein the reflecting surface of the mirror is formed by a plurality of stacks, a large reflecting surface may be obtained while the height of the stacks may be relatively modest.

In an embodiment, there is provided a method of manufacturing a dichroic mirror configured to separate a first type of radiation in a first wavelength range having an upper boundary from a second type of radiation in a second wavelength range having a lower boundary greater than the upper boundary of the first wavelength range. The method includes forming an etch stack comprising alternating layers of first and second materials on a substrate surface, the first and second materials being configured to provide relative etch selectivity. The method includes creating a plurality of staircase patterns in the etch stack, wherein the staircase patterns have at least three levels and each level is formed by (i) forming a resist film on top of the stack, (ii) exposing respective patterned regions and developing to uncover regions of the stack, (iii) etching one or more layers of the stack at an uncovered region of resist, and repeating steps (i) through (iii), such that for a plurality of levels, a width of the uncovered region is decreased.

The dichroic mirror according to an embodiment of the present invention may allow for an efficient way of manufacturing with a method of manufacturing according to an embodiment of the invention that includes forming an etch stack that includes alternating layers of first and second materials on a substrate surface. The first and second materials are configured to provide relative etch selectivity. The method includes creating a plurality of staircase patterns in the etch stack. The staircase patterns have at least three levels wherein each level is formed by: (i) forming a resist film on top of the stack; (ii) exposing respective patterned regions and developing to uncover regions of the stack; (iii) etching at least one layer of the stack where uncovered of resist; and (iv) repeating steps (i) through (iii). For a plurality of levels, a width of one or more uncovered region is decreased. Depending on the shape of the stack(s) to be formed the width of the uncovered regions may be decreased in a different way. A symmetric shape can be obtained for example if the width of the uncovered regions is decreased by shrinking the uncovered regions at both sides with a width W. An asymmetric shape is obtained for example if the uncovered regions are shrunk at one side with the width W. The W has a value in the range $\lambda 1 < W < \lambda 2$ in comparison to the area for a respective preceding level.

In an embodiment, each of the first and the second materials may have a specific etching agent and/or etching method for which the other material is insensitive. In this case the process of etching a layer of the first material stops when the surface of the layer of the second material is reached. Likewise the process of etching a layer of the second material stops when the surface of the layer of the first material is reached. Accordingly after each etching step a flat surface remains of the layer insensitive for that etching step.

It may be sufficient if the first material is insensitive to an etching agent or method used for the other material. In an embodiment, the layers formed by the first material form an etch stop layer for the layers formed by the second material. The layers of the first material may have a thickness that is relatively small as compared to the layers of the second material. In that case each etching cycle may include two steps. In the first step the uncovered portion of the hard mask formed by the layer of the first material may be removed by a first etching agent or method for that first material. The subsequent layer of the second material may also be partially etched. In the second step the uncovered portion of the subsequent layer of the second material is fully etched away by a second etching agent and/or method. Because the subsequent layer of the first material is insensitive to this agent and/or method this etching step ends at the surface of the subsequent layer, so that a flat surface is obtained.

Examples of materials having a mutually different etch sensitivity are know as such. For example, the first material may be a silicon nitride or a silicon carbide, and the second material may be a phospho silicate glass. In an embodiment, the first material may serve as a hard mask. In an embodiment, a combination may be used of $Al_2O_3$ as the first material and $SiO_2$ as the second material. The first material may be etched by a CCl4. The second material is etched by a combination of gases $CF_4$ and $CHF_3$. The first material is substantially insensitive for this combination.

In an embodiment the stacks have a height H, and are arranged at the substrate with a pitch P, a ratio P/H between the pitch and the height being in a range of between about 5 and about 25. With a ratio substantially larger than 25, e.g. 50, the angle between the normal of the individual steps and the normal of the surface interpolated through the steps is relatively small, so that the two types of radiation may become difficult to separate in a small optical design. With a ratio substantially smaller than 5, e.g. 2, a relatively large height of the stacks is desired, which may result in relatively large manufacturing costs of the dichroic mirror.

A high reflectivity of the dichroic mirror for both the first and the second type of radiation may be obtained in that the first material and/or second material has a high reflectivity for these two types of radiation.

In an embodiment of the dichroic mirror according to the invention, a surface of the stack facing away from the substrate is provided with a reflecting coating. The reflecting coating has an outer contour that substantially matches a relief profile formed by the stacks. This may make it possible to select the first and the second materials from a larger group of materials.

The reflecting coating may comprise a reflecting layer. In an embodiment of a dichroic mirror configured to separate infrared radiation from EUV radiation, a layer of, for example, Ru, Pd, or Rh may be used. These materials have a relatively good reflectivity for both types of radiation.

In an embodiment, the reflecting coating may be formed by a Bragg-reflector, for example a reflector stack comprising a 10-100 Mb/Si bi-layers. In practice a reflective coating that includes a single reflecting layer may be desirable for a grazing incidence application of the mirror, and reflective coating formed by a Bragg-reflector may be desirable in case of a normal incidence application.

According to an aspect of the invention a lithographic apparatus is provided. The apparatus includes a radiation source configured to provide a beam of radiation; an illumination system configured to condition the beam of radiation; a support configured to support a patterning device, the patterning device configured to impart the beam with a pattern in its cross-section; a substrate table configured to hold a substrate; a projection system configured to project the patterned beam onto a target portion of the substrate; and a dichroic mirror according to embodiments of the invention described herein arranged in the optic path between the radiation source and the substrate.

According to an aspect of the invention a lithographic apparatus is provided. The apparatus includes a radiation source configured to provide a beam of radiation; an illumination system configured to condition the beam of radiation; a support configured to support a patterning device, the patterning device configured to impart the beam with a pattern in its cross-section; a substrate table configured to hold a substrate; a projection system configured to project the patterned beam onto a target portion of the substrate; and a dichroic mirror arranged between the radiation source and the substrate. The dichroic mirror is configured to separate a first type of radiation in a first wavelength range having an upper boundary from a second type of radiation in a second wavelength range having a lower boundary greater than the upper boundary of the first wavelength. The dichroic mirror includes a mirror substrate, and a stack having a reflective surface facing away from the mirror substrate and a width that increases stepwise in a direction towards the mirror substrate, the stack being formed by alternating layers of first and second materials on the mirror substrate, the reflective surface having steps with a width greater than the upper boundary of the first wavelength and less than the lower boundary of the second wavelength.

In an embodiment, there is provided a device manufacturing method that includes providing a beam of radiation, and removing a undesired radiation of the beam with a dichroic mirror to form a filtered beam of radiation. The dichroic mirror includes a substrate, and at least one stack having a reflective surface facing away from the substrate and a width that increases stepwise in a direction towards the substrate. The stack is formed by alternating layers of first and second materials on the substrate. The reflective surface has steps with a width greater than an upper wavelength boundary of a desired radiation and less than a lower wavelength boundary of the undesired radiation. The method includes patterning the filtered beam of filtered radiation, and projecting a patterned beam of radiation onto a target portion of a substrate.

A dichroic mirror according to an embodiment of the invention may be particularly suitable for application in a lithographic apparatus. As described above, the radiation source is designed to generate radiation of an short wavelength, such as radiation in the EUV-range, in order obtain patterns in the target substrate having small critical dimensions. However, EUV-sources available in practice also generate radiate radiation in the infrared range. As the inventive dichroic mirror is arranged in the optic path between the radiation source and the patterning device in the lithographic apparatus according to the invention, infrared radiation may be substantially suppressed.

BRIEF DESCRIPTION OF THE DRAWINGS

These and other aspects are described in more detail with reference to the drawings, in which.

DETAILED DESCRIPTION

Embodiments of the invention are described more fully hereinafter with reference to the accompanying drawings, in which embodiments of the invention are shown. Embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

Figure 1A:
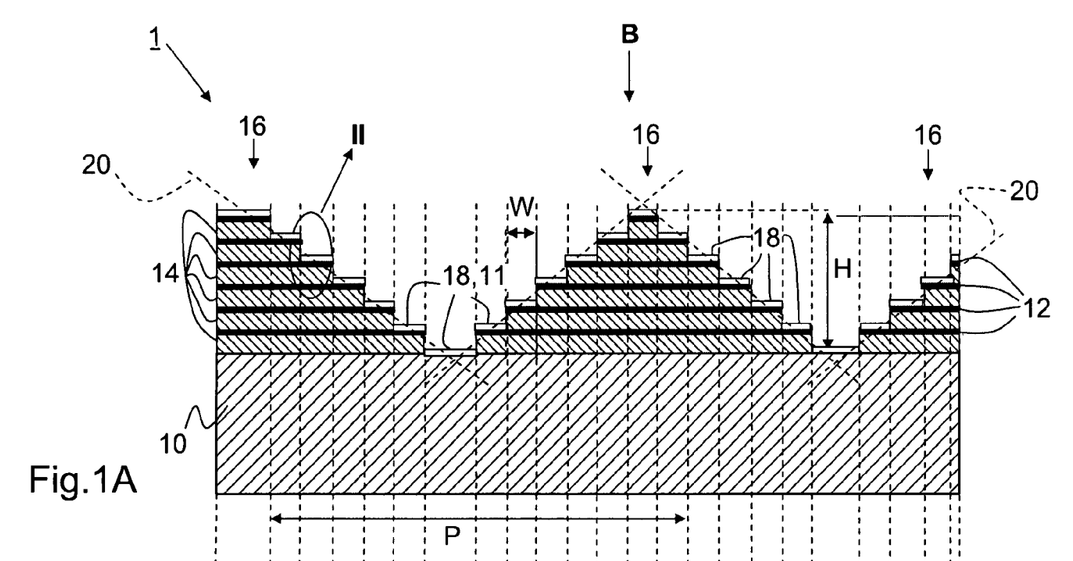
FIG. 1A shows in cross-section of a dichroic mirror according to an embodiment of the invention.
Figure 1B:
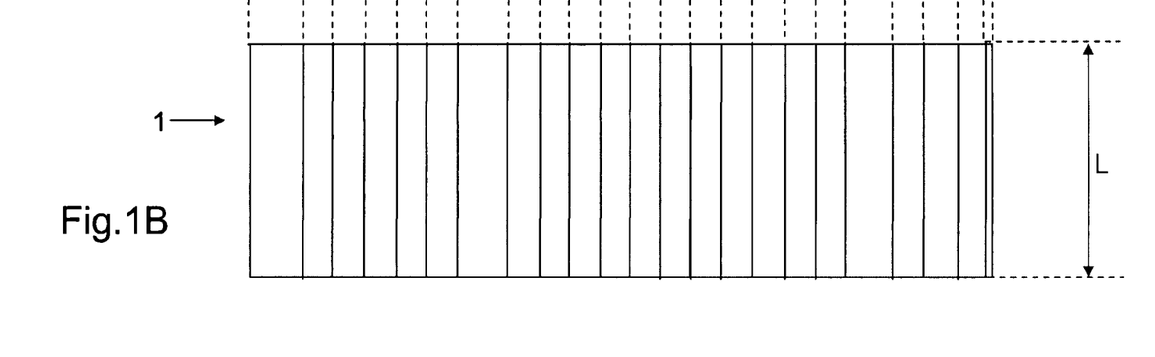
FIG. 1B shows a top-view of the dichroic mirror according to B in FIG. 1A.

FIG. 1A, 1B show a dichroic mirror 1 configured to separate a first type of radiation in a first wavelength range having an upper boundary $\lambda 1$ from a second type of radiation in a second wavelength range having a lower boundary $\lambda 2$ greater than $\lambda 1$. Therein FIG. 1A shows a cross-section of the mirror 1 and FIG. 1B shows a top-view according to arrow B in FIG. 1A. In the embodiment shown the first type of radiation is radiation in the extreme UV range having a wavelength of less than $\lambda 1$ of about 100 nm and the second type of radiation is radiation in the infrared range, having a wavelength greater than $\lambda 2$ of about 1 µm.

The mirror includes a substrate 10, at least one stack, here a plurality of stacks 16 formed by alternating layers 12, 14 of first and second materials on the substrate 10. The first and second materials are configured to provide relative etch selectivity. A width of the stacks increases stepwise in a direction towards the substrate 10. The reflecting surface has steps 11 with a width W. The width W has a value in the range $\lambda 1 < W < \lambda 2$. The steps have a length L in a direction transverse to the width W. Although only three stacks 16 are shown, in an embodiment, a larger plurality of steps may be present. In the embodiment shown the width W of the steps is 5 µm. However, the width may have another value in the above-mentioned range, e.g. a width in the range of 0.1 to 8 µm.

In the embodiment shown the stacks 16 have a height H, and are arranged on the substrate with a pitch P. The ratio P/H between the pitch and the height is desirably in a range of between about 5 and about 25. With a ratio substantially larger than 25, e.g. 50, the angle between the normal of the individual steps and the normal of the surface interpolated through the steps is relatively small, so that the two types of radiation may become difficult to separate in a small optical design. With a ratio substantially smaller than 5, e.g. 2, a relatively large height of the stacks is desired, which may result in relatively large manufacturing costs of the dichroic mirror. In the embodiment shown the stacks include twelve layers. These twelve layers include six layers 12 of a first material and six layers 14 of a second material that alternate with each other. In the embodiment shown the layers 12 include silicium nitride as the first material and have a thickness of about 50 nm. The layers 14 include phosphor silicate glass as the second material and have a thickness of about 500 nm.

Accordingly the height of the stacks formed is about 3.3 µm. In this embodiment, the pitch P of the stacks 16 is about 50 µm. Accordingly, the ratio P/H between the pitch and the height has a value of about 15 in this embodiment.

In the embodiment shown the width of the stacks increases stepwise at each next layer 12 of the first material so that only the surface of these layer is visible seen from the top-view. Alternatively the width may increase at each layer, both the layers 12 of the first material and the layers of the second material. In an embodiment the stack may maintain the same width over a larger number of layers, e.g. the width of the stack may increase at the second, the fourth and sixth layer, while the width may be substantially constant at the intermediate layer.

A surface of the stacks 16 facing away from the substrate 10 may be provided with a reflecting coating 18, wherein the reflecting coating 18 has an outer contour that substantially matches a relief profile formed by the stacks 16. In the embodiment shown the reflecting coating includes a reflecting layer, here a ruthenium layer having a thickness in the range of 5-20 nm for example. If the dichroic mirror is arranged near the radiation source, a substantially larger layer thickness e.g. in the order of several µm may be applied. In an embodiment, a layer of palladium or ruthenium may serve as a reflective coating. These materials have a good reflectivity for radiation in the extreme UV range. In an embodiment, a reflective coating may be formed by a Bragg-reflector, for example a reflector stack including 10-100 Mb/Si bi-layers of 4-8 nm thickness. A separate reflective coating may be omitted if the layers of the stacks 16 that are visible at the surface facing away from the substrate 10 already are sufficiently reflective for the two types of radiation that are to be separated.

Figure 1C:
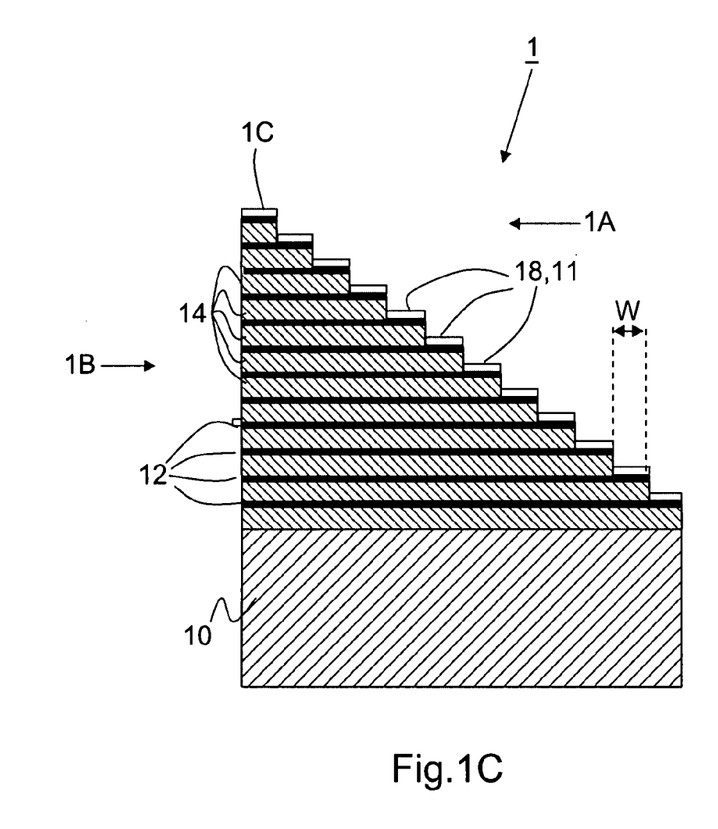
FIG. 1C shows in cross-section of a dichroic mirror according to an embodiment of the invention.

FIG. 1C shows in cross-section a dichroic mirror according to an embodiment of the invention. Parts therein corresponding to those in FIGS. 1A and 1B have the same reference numbers. In this embodiment the dichroic mirror includes a single asymmetric stack, that stepwise inclines at a first side 1A of its top 1C, and that has a surface substantially transverse to the surface of the substrate on the opposite side 1B. In this embodiment the stack includes 12 bi-layers each including a first layer of a first material and a second layer of a second material. The materials are configured to have mutually different etch sensitivities.

Figure 2:
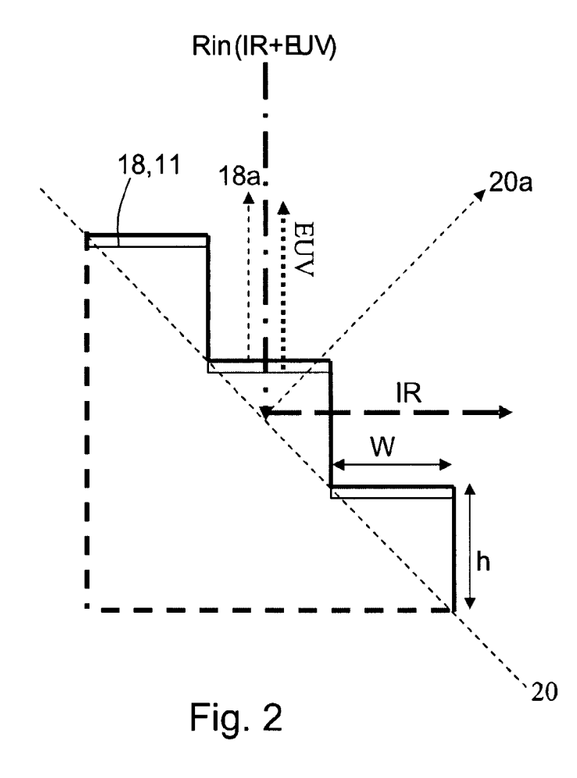
FIG. 2 schematically shows an enlarged portion of the dichroic mirror indicated by II in FIG. 1A, and illustrates an aspect of the operation of the dichroic mirror.

FIG. 2 illustrates how the mirror separates the first type of radiation EUV from the second type of radiation IR. FIG. 2 schematically shows an enlarged portion of the dichroic mirror indicated by II in FIG. 1A. Parts therein corresponding to those in FIGS. 1A, 1B have the same reference numerals. An incident beam Rin of radiation, includes radiation of a first type EUV, in particular having a wavelength of 13.4 nm and radiation of a second type IR, here having a wavelength of 10.6 µm. As the wavelength 13.4 nm of the EUV radiation is substantially smaller than the width W of the steps, here 5 µm, the details of the mirror formed by the steps are visible, so that the direction of reflection of the EUV radiation is determined by the normal 18a of the steps. In this case where the incident beam of radiation has an angle substantially parallel with the normal 18a, the EUV part of the incident beam is reflected substantially in the direction of the normal. As the wavelength 10.6 µm of the infrared radiation is larger than the details with width W of 5 µm formed by the steps, only the global inclination is visible in this wavelength range. Hence, for this wavelength range the reflecting surface appears as a plane 20 through the steps. This reflecting surface 20 has a surface normal 20a that is rotated with respect to the surface normal 18a of the individual steps. Accordingly the infrared radiation IR is radiated at an angle differing from that of the extreme ultraviolet radiation EUV.

Figure 3A:
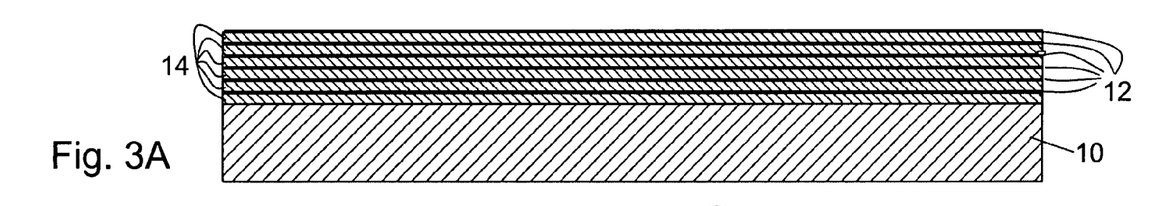
FIGS. 3A-3D illustrates steps of a method for manufacturing a dichroic mirror according to an embodiment of the invention.

FIGS. 3A to 3D illustrate an embodiment of a method of manufacturing a dichroic mirror as described with reference to FIGS. 1A, 1B and 2. The method includes: forming an etch stack including alternating layers 12, 14 of first and second materials on a surface of the substrate 10 where the two materials can provide relative etch selectivity; the alternating layers 12, 14 may be deposited in a way known as such, e.g. by chemical vapor deposition, but also by for example spray-coating, slit-coating, slot-die coating, extrusion coating, printing like ink-jet printing, flexoprinting, offset printing, or spin-coating. After this step the layered structure shown in FIG. 3A is obtained. If the layers so applied are not considered sufficiently flat, an intermediate planarization step may be applied, for example by chemical mechanical polishing (CMP).

Subsequently, a plurality of stair case patterns is created in the etch stack. By repeating the following steps (i) to (iii):
(i) forming a resist film 15 on top of the stack;
(ii) exposing respective patterned regions and developing to uncover regions of the stack; and
(iii) etching one or more layers of the stack where uncovered of resist.

Figure 3B:
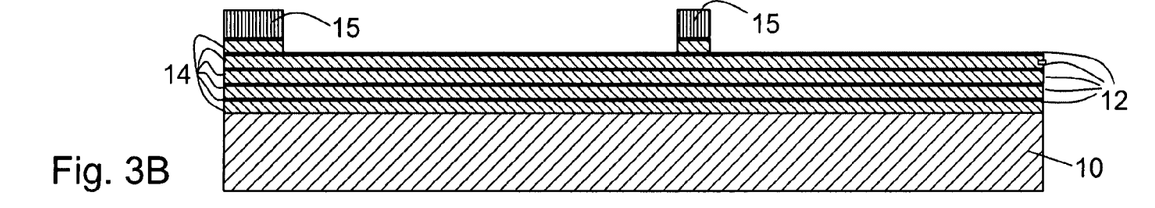

After applying this sequence of steps (i) to (iii) for the first time, the portion of the layer 12 most remote from the substrate 10 not covered by resist layer is removed. Then with another etching agent for which the layers of the first material are not sensitive, an uncovered portion of the layer 14 of the second material most remote from the substrate 10 is removed, so that the structure shown in FIG. 3B is obtained.

The sequence of steps (i) to (iii) is then repeated for a second time. Therein the width of the uncovered region is decreased by covering an additional surface with resist 15. In this case each strip of resist 15 is widened on both sides with a width W. After repeating steps (i) to (iii) for the second time wherein first a layer 12 of the first material and then a layer 14 of the second material is etched by a respective etch method or agent, the structure shown in FIG. 3C is obtained.

Figures 3C, 3D:
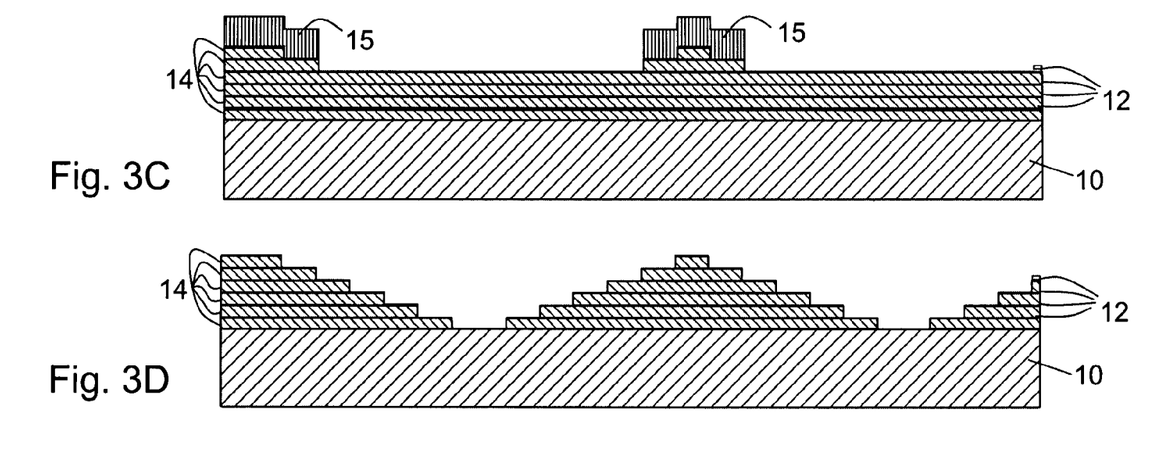

After repeating steps (i) to (iii) for another five times and subsequently removing the remaining resist, the structure shown in FIG. 3D is obtained. A surface (top-surface) of this structure facing away from the substrate 10 may be provided with a reflecting layer, if this top-surface is not itself reflecting for both types of radiation.

Figures 4A, 4B:
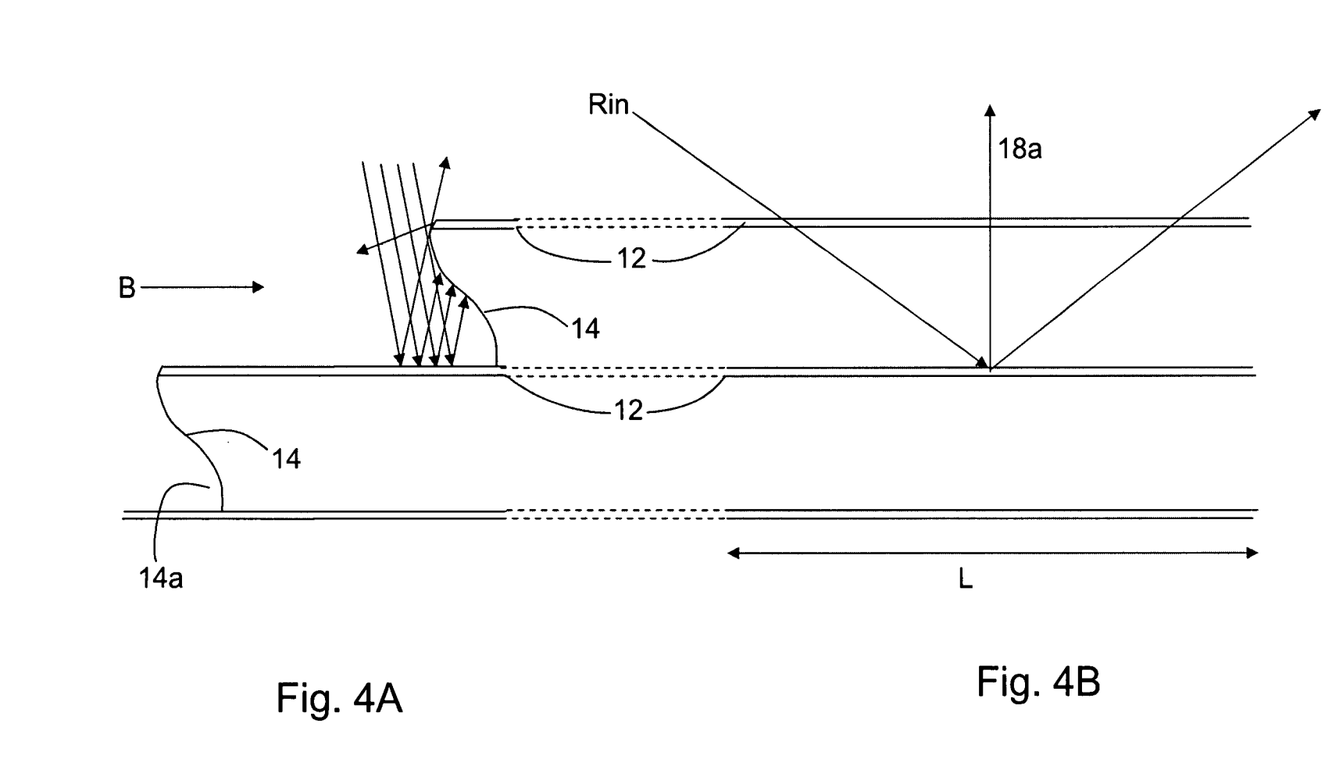
FIGS. 4A and 4B illustrate an aspect of the operation of the mirror obtained with the method illustrated with reference to FIGS. 3A-3D.

FIGS. 4A and 4B schematically show a part of the structure obtained according to the method according to the present invention. FIG. 4A shows the part in cross-section, and FIG. 4B shows the part according to a side view as indicated by arrow B in FIG. 4A. Parts therein corresponding to the previous Figures have corresponding reference numerals. As shown therein due to the step of etching the layers 12, 14, the layers 14 may show an undercut 14a. A portion of the radiation may be lost when it reflects against the undercut region of the layers 14. In practice this loss of radiation is negligible if a plane through the normal 18a of the reflective surface and optical path of the incident radiation Rin is oriented along the length direction of the steps, i.e. transverse to the direction in which the stacks widen stepwise.

Figures 5, 5A:
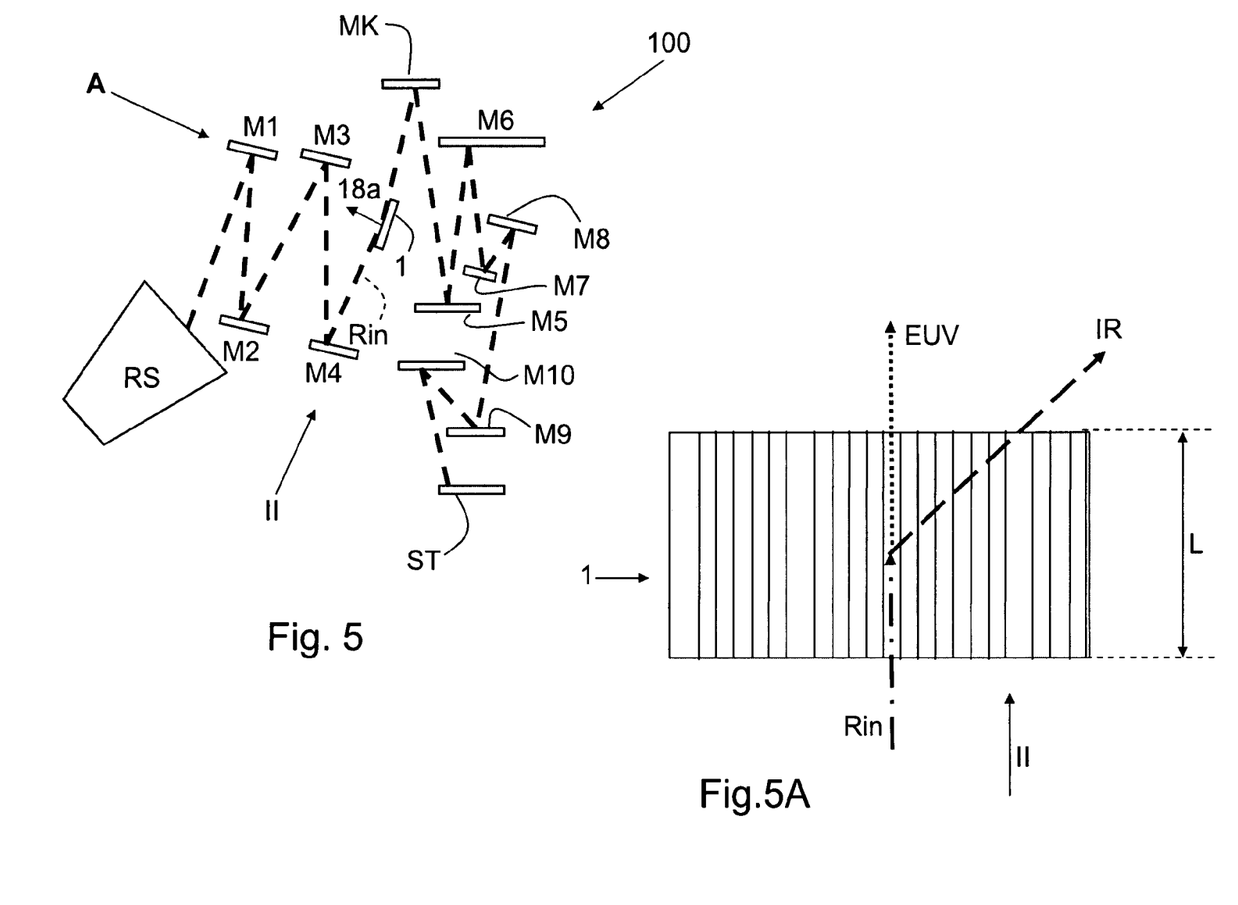
FIG. 5 illustrates a lithographic apparatus according to an embodiment of the present invention.
FIG. 5A illustrates a top view of a dichroic mirror as used in the lithographic device according to A in FIG. 5.

FIG. 5 schematically shows a lithographic apparatus 100 according to an embodiment of the invention. The lithographic apparatus includes a radiation source RS for providing a beam of radiation. The lithographic apparatus 100 includes an illumination system with mirrors M1-M4 configured to condition the beam of radiation. The lithographic apparatus 100 is provided with a support configured to support a patterning device MK. The patterning device MK is configured to impart the beam with a pattern in its cross-section. The patterned beam is projected by a projection system, including mirrors M5-M10 onto a target portion of a substrate ST. The substrate ST arranged at a substrate support, such as a substrate table, configured to hold the substrate ST.

A dichroic mirror 1 as described with reference to FIGS. 1A to 4B is arranged between the radiation source RS and the substrate ST. In the embodiment shown the dichroic mirror 1 is arranged in the optical path between the illumination system M1-M4 and the patterning device MK. The dichroic mirror 1 is arranged as a grazing incidence mirror, in particular the angle between the incident beam Rin, provided by the illumination system M1-M4 and the normal of 18a of the surface is in a range between 75 and 89 degrees. However, because a plane through the normal 18a of the reflective surface, which is the normal with respective to the surface of the individual steps 11 and optical path of the incident radiation Rin is oriented along the length direction of the steps 11, the loss of EUV-radiation is negligible. This is further clarified in FIG. 5A, which shows a top view of the mirror according to arrow A in FIG. 5, i.e. a view in a direction perpendicular to the surface of the steps 11 of the mirror 1. The incoming beam of radiation Rin is incident in a plane transverse to the surface of the steps and arranged along the length direction of the steps. The EUV component of the incoming beam of radiation is also reflected in this plane. The IR component is however reflected in the plane through the incoming beam Rin and the normal 20a of the plane 20 interpolated through the steps 11. Reference is also made to FIG. 2 which also corresponds to a side view of the mirror 1 of FIG. 5A according to arrow II in FIG. 5A and arrow II in FIG. 5.

A grazing incidence mirror may be flat or curved in a single direction, which is advantageous. All other mirrors are double curved. A grazing mirror may be provided with a reflective surface formed by a single layer of a material reflective for the desired type of radiation, e.g. a layer of Ru, Pt or Rh in case of EUV radiation. It is sufficient if the layer is flat contrary to the case with a reflective surface formed by a multi-layer which has extreme severe requirement for the layer uniformity and absolute thickness. This is relatively costly to manufacture in case of a stepped surface.

In an embodiment, the dichroic mirror may not be arranged between the illumination system and the patterning device. The dichroic mirror according to an embodiment of the present invention may be arranged at another position in the optical path. The dichroic mirror may for example be arranged in the optical path between two mirrors of the illumination system, or between the radiation source and the illumination system.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

What is claimed is:

1. A dichroic mirror configured to separate a first type of radiation in a first wavelength range having an upper boundary from a second type of radiation in a second wavelength range having a lower boundary greater than the upper boundary of the first wavelength, the mirror comprising:
    a substrate having a continuous planar surface; and
    a stack supported by the continuous planar surface of the substrate, the stack having a reflective surface facing away from the substrate and a width that increases stepwise in a direction towards the continuous planar surface of the substrate, the stack being formed by alternating layers of first and second materials on the continuous planar surface of the substrate, the reflective surface having steps with a width greater than the upper boundary of the first wavelength and less than the lower boundary of the second wavelength.

2. The dichroic mirror according to claim 1, wherein a surface of the stack, facing away from the substrate is provided with a reflecting coating, and wherein the reflecting coating has an outer contour that substantially matches a relief profile formed by the at least one stack.

3. The dichroic mirror according to claim 2, wherein the reflecting coating comprises a reflecting layer.

4. The dichroic mirror according to claim 2, wherein the reflecting coating comprises a Bragg-reflector.

5. The dichroic mirror according to claim 1, wherein the first type of radiation is extreme ultraviolet radiation, and the second type of radiation is infrared radiation.

6. The dichroic mirror according to claim 1, wherein the mirror comprises a plurality of stacks supported by the continuous planar surface of the substrate, wherein each stack has a reflective surface facing away from the substrate and a width that increases stepwise in the direction towards the continuous planar surface of the substrate, and wherein each stack is formed by alternating layers of the first and second materials on the continuous planar surface of the substrate, the reflective surfaces having steps with widths greater than the upper boundary of the first wavelength and less than the lower boundary of the second wavelength.

7. The dichroic mirror according to claim 1, wherein a cross-section of the stack taken through the steps has a symmetric shape.

8. A lithographic apparatus, comprising:
    a radiation source configured to provide a beam of radiation;
    an illumination system configured to condition the beam of radiation;
    a support configured to support a patterning device, the patterning device configured to impart the beam with a pattern in its cross-section;
    a substrate support configured to hold a substrate;
    a projection system configured to project the patterned beam onto a target portion of the substrate; and
    a dichroic mirror arranged between the radiation source and the substrate, the dichroic mirror being configured to separate a first type of radiation in a first wavelength range having an upper boundary from a second type of radiation in a second wavelength range having a lower boundary greater than the upper boundary of the first wavelength, the dichroic mirror comprising
        a mirror substrate having a continuous planar surface, and
        a stack supported by the continuous planar surface of the mirror substrate, the stack having a reflective surface facing away from the mirror substrate and a width that increases stepwise in a direction towards the continuous planar surface of the mirror substrate, the stack being formed by alternating layers of first and second materials on the continuous planar surface of the mirror substrate, the reflective surface having steps with a width greater than the upper boundary of the first wavelength and less than the lower boundary of the second wavelength.

9. The lithographic apparatus according to claim 8, wherein a plane through the normal of the reflective surface of the dichroic mirror and the optical path of incident radiation on the reflective surface is oriented along a length direction of the steps.

10. The lithographic apparatus according to claim 8, wherein the dichroic mirror comprises a plurality of stacks supported by the continuous planar surface of the substrate, wherein each stack has a reflective surface facing away from the substrate and a width that increases stepwise in the direction towards the continuous planar surface of the substrate, and wherein each stack is formed by alternating layers of the first and second materials on the continuous planar surface of the substrate, the reflective surfaces having steps with widths greater than the upper boundary of the first wavelength and less than the lower boundary of the second wavelength.

11. The lithographic apparatus of claim 8, wherein a cross-section of the stack of the dichroic mirror taken through the steps has a symmetric shape.

12. A device manufacturing method, comprising:
providing a beam of radiation; and
removing a undesired radiation of the beam with a dichroic mirror to form a filtered beam of radiation, the dichroic mirror comprising
 a substrate having a continuous planar surface, and
 a stack supported by the continuous planar surface of the substrate, the stack having a reflective surface facing away from the substrate and a width that increases stepwise in a direction towards the continuous planar surface of the substrate, the stack being formed by alternating layers of first and second materials on the continuous planar surface of the substrate, the reflective surface having steps with a width greater than an upper wavelength boundary of a desired radiation and less than a lower wavelength boundary of the undesired radiation;
patterning the filtered beam of radiation; and
projecting a patterned beam of radiation onto a target portion of a device substrate.

13. The device manufacturing method according to claim 12, wherein the dichroic mirror comprises a plurality of stacks supported by the continuous planar surface of the substrate, wherein each stack has a reflective surface facing away from the substrate and a width that increases stepwise in the direction towards the continuous planar surface of the substrate, and wherein each stack is formed by alternating layers of the first and second materials on the continuous planar surface of the substrate, the reflective surfaces having steps with widths greater than the upper wavelength boundary of the desired radiation and less than the lower wavelength boundary of the undesired radiation.

14. A device manufactured according to the method of claim 12.

15. The device manufacturing method of claim 12, wherein a cross-section of the stack taken through the steps has a symmetric shape.

* * * * *